(12) United States Patent
Viani

(10) Patent No.: US 9,059,700 B2
(45) Date of Patent: Jun. 16, 2015

(54) VOLTAGE TRANSLATOR

(71) Applicant: QUALCOMM Incorporated, San Diego, CA (US)

(72) Inventor: Paul Viani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 161 days.

(21) Appl. No.: 13/757,580

(22) Filed: Feb. 1, 2013

(65) Prior Publication Data

US 2014/0218070 A1    Aug. 7, 2014

(51) Int. Cl.
*H03K 19/0185* (2006.01)
*H03K 19/0175* (2006.01)

(52) U.S. Cl.
CPC ............. *H03K 19/018521* (2013.01); *H03K 19/018507* (2013.01)

(58) Field of Classification Search
USPC ................... 326/63, 68, 80, 81, 83; 327/333
See application file for complete search history.

(56) References Cited

U.S. PATENT DOCUMENTS

| 7,145,364 | B2 | 12/2006 | Bhattacharya et al. | |
|---|---|---|---|---|
| 7,274,209 | B1 | 9/2007 | Reinschmidt | |
| 7,397,279 | B2 | 7/2008 | Bhattacharya et al. | |
| 8,283,964 | B2 | 10/2012 | Cassia | |
| 2005/0068062 | A1* | 3/2005 | Yamasaki et al. | 326/81 |
| 2005/0258864 | A1* | 11/2005 | Chen et al. | 326/81 |
| 2006/0091907 | A1* | 5/2006 | Khan | 326/81 |
| 2011/0187431 | A1 | 8/2011 | Bhattacharya et al. | |
| 2014/0218070 | A1* | 8/2014 | Viani | 326/81 |

* cited by examiner

*Primary Examiner* — Daniel D Chang
(74) *Attorney, Agent, or Firm* — Haynes and Boone, LLP

(57) ABSTRACT

A voltage translator translates an input voltage signal in a low voltage domain into a output voltage signal in a high voltage domain using a latch that includes a pair of cross-coupled inverters. The bottom rail voltages for the cross-coupled inverters are varied dynamically to speed switching time for the voltage translator.

20 Claims, 6 Drawing Sheets

FIG. 1 -PRIOR ART-

VOLTAGE TRANSLATOR

TECHNICAL FIELD

This application relates to voltage translating, and more particularly to a voltage translator that uses a dynamically adjusted bottom rail voltage to enhance voltage translation speed.

BACKGROUND

Voltage translator circuits typically incorporate a latch because the cross-coupled logic gates in a latch ideally do not consume any current unless they are switching states. For example, consider a prior art voltage translator 100 shown in FIG. 1. Voltage translator circuit 100 translates an input voltage signal Vin_p and its complement Vin_n into corresponding output voltage signals Vout_p and its complement Vout_n, respectively. The input voltage signals are in a low voltage domain whereas the output signals are in a high voltage domain.

To distinguish between the logic states in the different voltage domains, lower case letters (logic low and logic high) will refer herein to the logic states in the low voltage domain. Thus, one of the input voltage signals Vin_p and Vin_n will be logic high whereas the other will be logic low. Conversely, the logic states in the high voltage domain will be capitalized (Logic High and Logic Low). One of the output voltage signals Vout_p and Vout_n will thus Logic High whereas the other will be Logic Low. Given these conventions, the problems with the switching speed of conventional latching voltage translator circuits such as circuit 100 will now be described.

The cross-coupled logic gates in voltage translator circuit 100 comprise a pair of NAND gates 105. The output nodes of NAND gates 105 are designated by the letter z. Each NAND gate 105 has a pair of input nodes a and b. Because gates 105 are cross-coupled, the input node b for each gate 105 is tied to the output node z for the opposing gate. To distinguish between NAND gates 105, one is deemed as the positive gate XMP since its output node z drives a positive internal latching node Vlatch_p. A remaining NAND gate 105 is designated as the negative gate XMN since its output node z drives a complementary internal latching node Vlatch_n. An inverter 130 inverts the logic state of node Vlatch_n to form output voltage signal Vout_p. Similarly, an inverter 135 inverts the logic state of node Vlatch_p to form complementary output voltage signal Vout_n.

Input voltage signal Vin_p drives the gate of an NMOS transistor 110 that has its source coupled to ground (Vss1 or logic low) and its drain coupled to the drain of a diode-connected PMOS transistor 120. The source of diode-connected PMOS transistor 120 couples to high voltage supply Vdd2 (the Logic High voltage value) whereas its gate/drain couples to the a input for positive gate XMP. Transistors 110 and 120 thus form an input path for input voltage signal Vin_p to positive gate XMP. Complementary input voltage signal Vin_n drives the a input of negative NAND gate XMN through a corresponding input path that comprises NMOS transistor 115 and a diode-connected PMOS transistor 125.

As shown in FIG. 2, each NAND gate 105 includes an inverter formed by a PMOS transistor 215 and an NMOS transistor 205. The b input for NAND gate 105 drives the gates of transistors 205 and 215 whereas the a input for NAND gate 105 drives the gates of a PMOS transistor 210 and an NMOS transistor 200. The source of NMOS transistor 200 is tied to an intermediate voltage supply Vss2 (voltage Vss2 being the Logic Low value). Referring again to FIG. 1, if input voltage signal Vin_p is logic low then this value is translated into a Logic Low value for output signal Vout_p. The z output of positive NAND gate XMP will thus be Logic Low as well whereas the z output of negative NAND gate XMN will be Logic High.

If input signal Vin_p is then switched to logic high, positive NAND gate XMP must then change states such that its inverter output z must flip from Logic Low to Logic High. To do so, PMOS transistor 210 in NAND gate XMP must switch from off to on whereas its NMOS transistor 200 must switch from on to off. One can see that the voltage for input node a to positive NAND gate XMP must fall to approximately (Vdd2−Vss2)/2 to switch PMOS transistor 210 on and switch off NMOS transistor 200. Such a switch involves three delays: There is a first delay for NMOS transistor 110 to turn on when input signal Vin_p switches to logic high. A second delay is incurred in getting diode-connected PMOS transistor 120 to turn on. Finally, there is the third delay to get PMOS transistor 210 to switch on and to get NMOS transistor 200 to switch off.

Analogous delays occur if complementary input voltage signal Vin_n is switched from logic low to logic high. In that case, there is the initial delay to get NMOS transistor 115 to turn on, which is then followed by the delay to get diode-connected PMOS transistor 125 to turn on. Finally, there is the delay required for PMOS transistor 210 in NAND gate XMN to switch on and for NMOS transistor 200 to switch off. One can thus see that regardless of the particular logic states for the input voltage signals Vin_p and Vin_n, the three delays discussed above will thus always be incurred whenever the input voltage signals switch logic states. Therefore, a conventional latching voltage translator requires substantial time to switch states such as 500 picoseconds. Not only is the delay problematic, but substantial current is consumed during these extended switching intervals.

Accordingly, there is a need in the art for improved voltage translators with faster switching times and correspondingly low power consumption.

SUMMARY

A voltage translator is disclosed that translates an input voltage signal into an output voltage signal. The input voltage signal is either a logic low (e.g., ground or Vss1) or a logic high value, which equals a low voltage Vdd1 from a low voltage supply. If the input voltage signal transitions to logic low, the voltage translator biases the output voltage signal to equal a Logic Low value, which equals an intermediate voltage Vss2 from an intermediate voltage supply. If the input voltage signal transitions to logic high, the voltage translator biases the output voltage signal to a Logic High value, which equals a high voltage Vdd2 from a high voltage supply.

The voltage translator receives the input voltage signal on an input path that couples to a latch including a pair of cross-coupled inverters. The output voltage signal is derived from an output of a first one of the cross-coupled inverters. A complementary output voltage signal is derived from an output of a remaining second one of the cross-coupled inverters. The bottom rail voltage for the first cross-coupled inverter is dynamically controlled responsive to the input voltage signal. Similarly, the bottom rail voltage for the second cross-coupled inverter is dynamically controlled responsive to a complement of the input voltage signal.

The dynamically control of the bottom rail voltage is such that the bottom rail voltage is increased when the corresponding input signal transitions from logic low to logic high. In contrast, the bottom rail voltage is biased to a lower intermediate voltage when the corresponding input signal transitions from logic high to logic low. For example, the bottom rail voltage for the first cross-coupled inverter is initially raised to a sum of the low voltage plus a transistor threshold voltage before settling to the low voltage responsive to the input voltage signal transitioning to the low voltage. Conversely, the bottom rail voltage for the first cross-coupled inverter is biased to the intermediate voltage responsive to the input signal voltage transitioning to ground. An analogous dynamic control of the bottom rail voltage for the second cross-coupled inverter occurs responsive to the logic state transitions in the complement of the input voltage signal.

Note that when the bottom rail for the first cross-coupled inverter is dynamically raised responsive to the input voltage signal transitioning to logic high, the bottom rail for the second cross-coupled inverter is lowered to Logic Low. This helps the second cross-coupled inverter lower its z output to Logic Low, which in turn helps the first cross-coupled inverter raise its z output to Logic High. Moreover, this dynamic raising and lowering of the bottom rail voltages does not require the first two delays discussed earlier with regard to turning on the two devices in the corresponding input path (transistors 110 and 120 or transistors 115 and 125). In this fashion, considerable switching speed is achieved with regard to conventional voltage translators. In addition, the increased switching speed lowers power consumption.

When the input voltage signal transitions to logic high, the first cross-coupled inverter must bring its output from Logic Low to Logic High. To do so, an NMOS transistor in the first cross-coupled inverter that had been conducting to pull the output to Logic Low must turn off. The dynamic increase in the bottom rail voltage responsive to the input voltage signal transitioning to logic high increases the speed with which the NMOS transistor can turn off. In this fashion, the first cross-coupled inverter switches its output to Logic High faster. A similar increase in switching speed occurs for the second cross-coupled inverter when a complement of the input voltage signal transitions to logic high (in which case the input voltage signal transitions to logic low). The resulting voltage translator thus has advantageously fast operation with regard to translating the input voltage signal.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

To address the need in the art for latching voltage translators with increased switching speed and lower power consumption, a latching voltage translator is provided that includes a pair of cross-coupled inverters. The voltage translator translates a pair of complementary input voltage signals in a low voltage domain into a corresponding pair of complementary output voltage signals in a high voltage domain. One of the input voltage signals is in a logic high state, which equals a low voltage Vdd1 from a low voltage supply. A remaining one of the input voltage signals is in a complementary logic low state that equals ground (Vss1). The output voltage signals are also complementary: one is in a Logic High state that equals a high voltage Vdd2 from a high voltage supply whereas the other is in a Logic Low state that equals an intermediate voltage Vss2 from an intermediate voltage supply.

To distinguish between the input voltage signals, one is denoted as a positive input voltage signal whereas the remaining input signal is denoted as a complementary negative input voltage signal. The output voltage signals are also divided into a positive output voltage signal and a complementary negative output voltage signal. The pair of cross-coupled inverters are similarly divided into a positive cross-coupled inverter and a negative cross-coupled inverter. The positive cross-coupled inverter has a bottom rail voltage that is dynamically controlled by the positive input voltage signal. Similarly, the negative cross-coupled inverter has a bottom rail voltage that is dynamically controlled by the negative input voltage signal. This dynamic control may be better understood with reference to FIG. 3.

Figure 3:
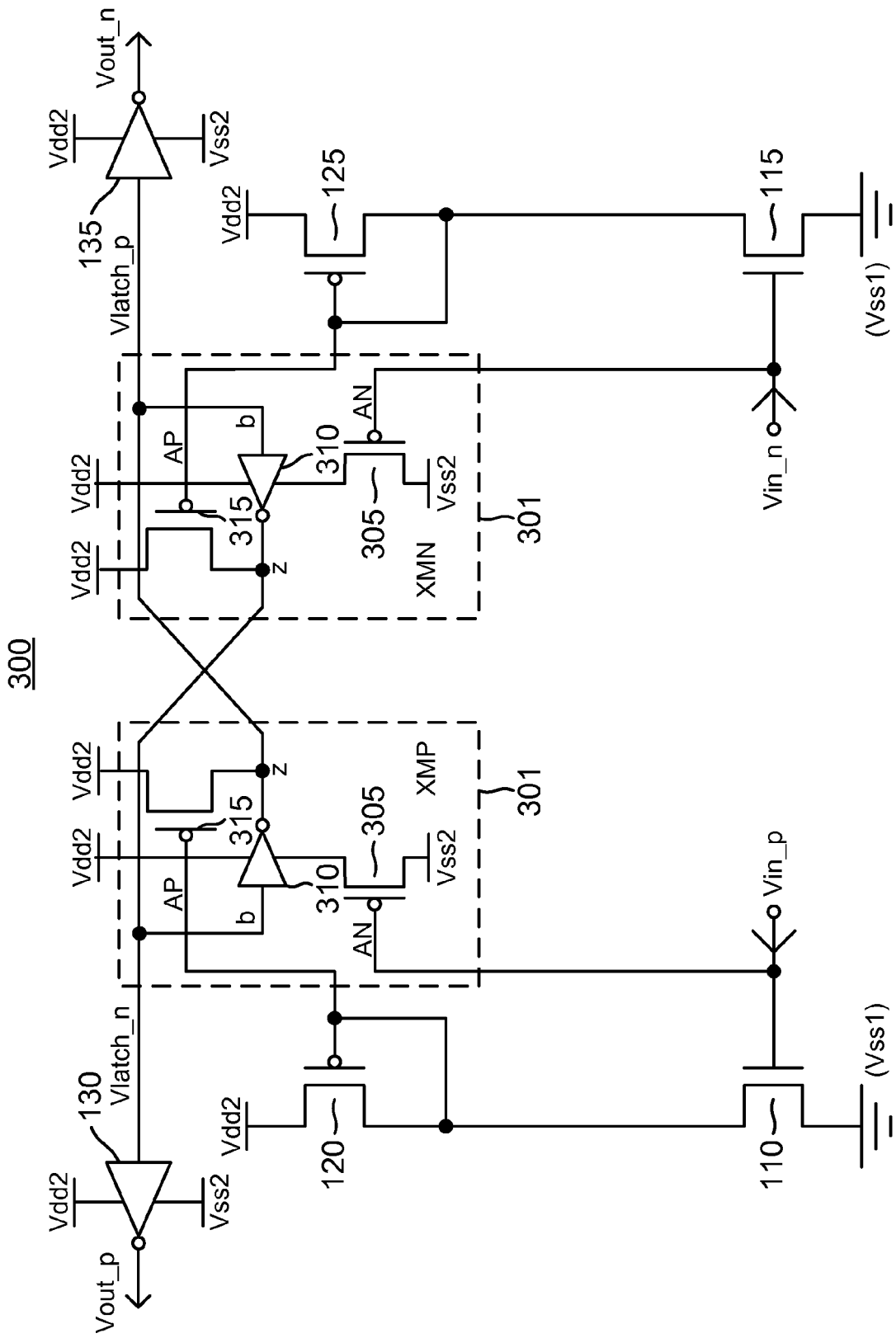
FIG. 3 is a schematic diagram of a voltage translator circuit including a cross-coupled pair of inverters having a dynamic lower voltage rail in accordance with an embodiment of the disclosure.

As shown in FIG. 3, a voltage translator circuit 300 includes a pair of cross-coupled logic gates 301. Voltage translator circuit 300 may also be denoted as a level shifter circuit 300. Logic gates 301 include a pair of corresponding cross-coupled inverters 310. Logic gates 301 are analogous to NAND gates 105 discussed earlier in that one gate 301 is designated as a positive gate XMP whereas a remaining gate 301 is designated as a negative gate XMN. Positive logic gate XMP thus controls the voltage of internal node Vlatch_p whereas negative logic gate XMN controls the voltage of internal node Vlatch_n. Inverters 130 and 135 also function as discussed with regard to FIG. 1.

Figure 1:
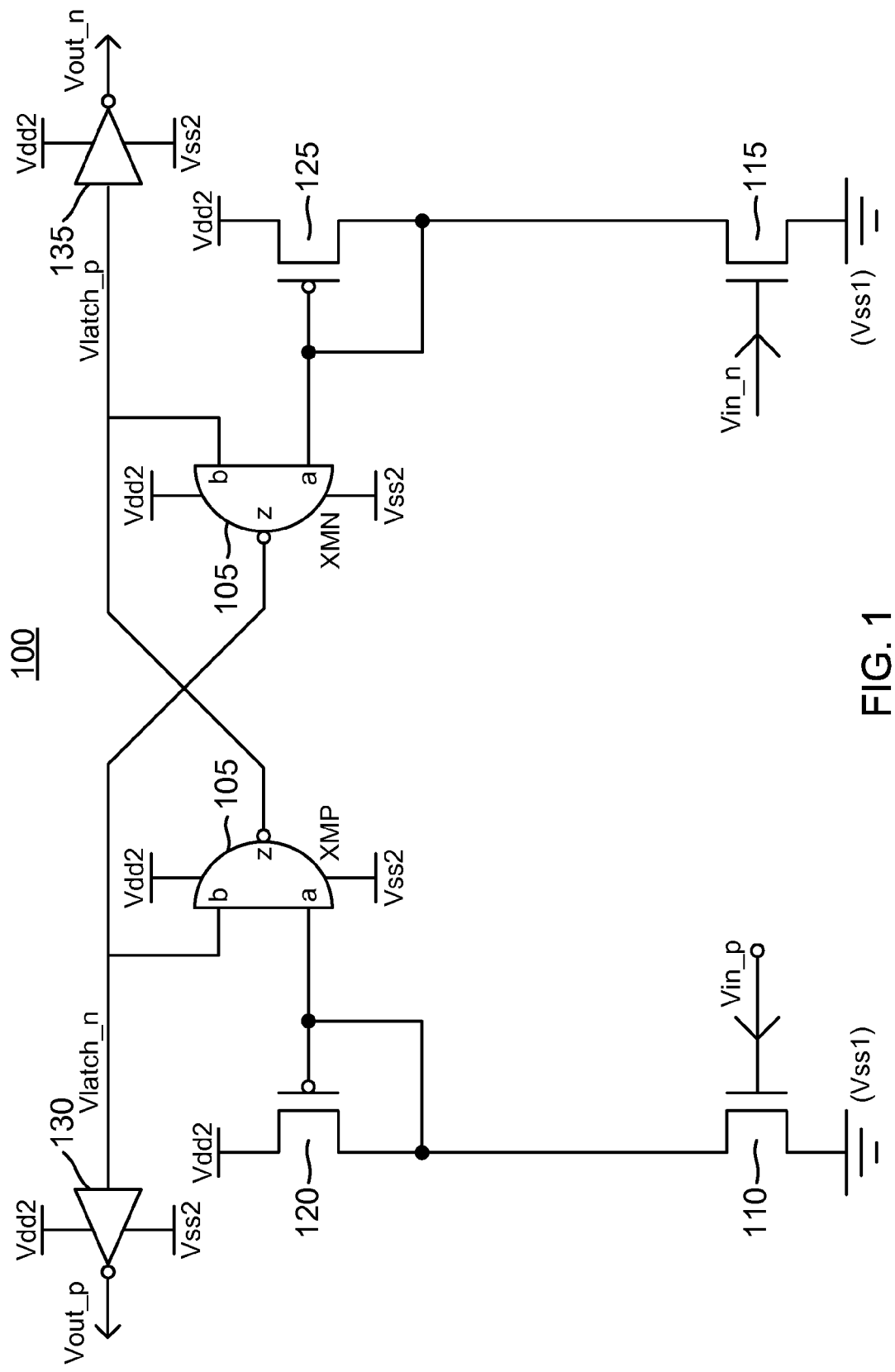
FIG. 1 is a schematic diagram for a conventional voltage translator circuit.
Figure 4:
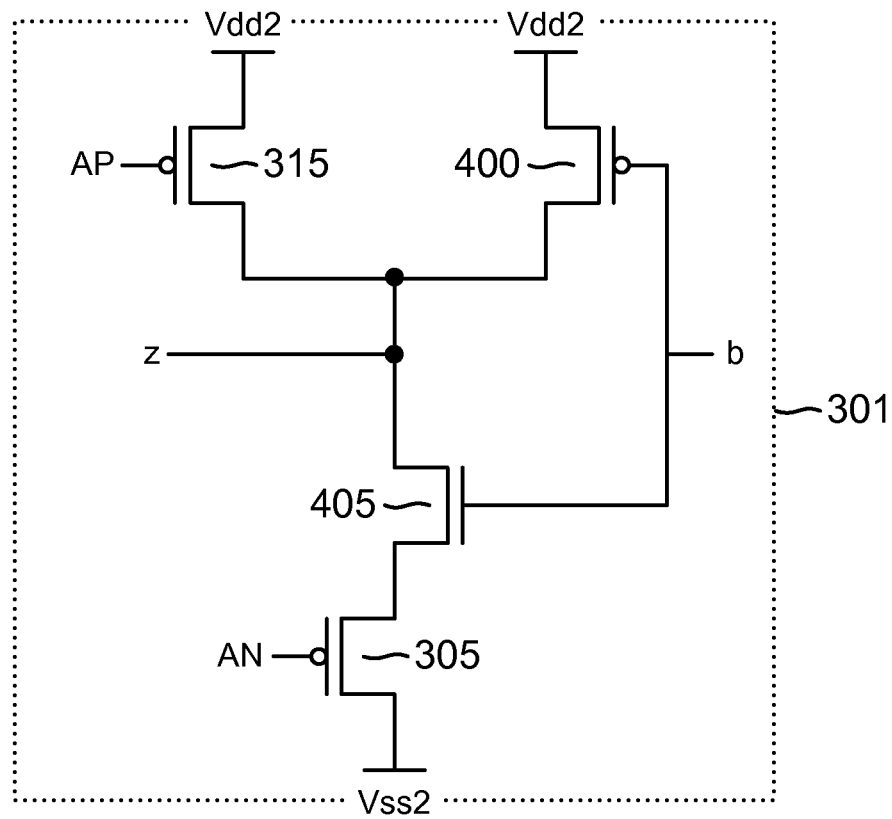
FIG. 4 is a schematic diagram of a logic gate in the voltage translator circuit of FIG. 3.

As further discussed with regard to FIG. 1, the positive input voltage signal Vin_p drives the gate of NMOS transistor 110 so as to turn this transistor on when positive input signal Vin_p transitions to logic high. The switching on of NMOS transistor 110 then switches on diode-connected PMOS transistor 120. The gate of diode-connected PMOS transistor 120 will lower below Vdd2 by at least the amount of the threshold voltage for PMOS transistor 120. This gate voltage drives an AP input to positive logic gate XMP. Each logic gate 301 is shown in more detail in FIG. 4. Input AP is analogous to input a for NAND gate 105 in that input AP controls the gate of a PMOS transistor 315. Like PMOS transistor 210, a drain of PMOS transistor 315 is tied to output node z whereas its source is tied to the high voltage supply Vdd2. Thus, in response to positive input voltage signal Vin_p switching to logic high, PMOS transistor 315 is switched on since its gate is pulled below Vdd2 by at least the amount of the threshold voltage.

But note that NMOS transistor 200 of NAND gate 105 is replaced by a PMOS transistor 305 in logic gate 301. Positive input voltage signal Vin_p drives the gate of PMOS transistor 305 in positive gate XMP. Similarly, negative input voltage signal Vin_n drives the gate of PMOS transistor 305 in negative gate XMN. This is quite advantageous in that switching either input signal from logic low to logic high acts to turn off PMOS transistor 305 in the corresponding logic gate without any intervening delays. There are no intervening delays because the input signals control the gates of PMOS transistors 305 directly. In other words, the initial delay incurred by the need for NMOS transistor 110 or 115 to turn on followed by the subsequent delay incurred by the need for diode-connected PMOS transistor 120 or 125 to turn on as discussed earlier with regard to NAND gate 105 are avoided with regard to turning off PMOS transistor 305.

The switching speed with respect to a corresponding input voltage signal switching from logic low to logic high is the same for either logic gate 301. The following discussion will thus focus on positive logic gate XMP without loss of generality. If positive input voltage signal Vin_p was in the logic low state, PMOS transistors 315 and 400 for positive gate XMP are both off. NMOS transistor 405 and PMOS transistor 305 are on. The source for PMOS transistor 305 is thus charged to the intermediate voltage Vss2 (Logic Low) from intermediate voltage supply Vss2. As positive input voltage Vin_p is switched to logic high (Vdd1), NMOS transistor 405 and PMOS transistor 305 must both transition from being on to being off. But initially, current is still flowing through PMOS transistor 305 despite its gate voltage being raised to Vdd1. The source for PMOS transistor 305 will thus temporally bump higher than Vdd1 by its threshold voltage. This raised voltage on the source of PMOS transistor 305 helps shut NMOS transistor 405 off faster. That means inverter 310, which includes NMOS transistor 405, flips states faster. In contrast, the analogous NMOS transistor 205 in NAND gate 105 discussed with regard to FIG. 1 cannot turn off until both NMOS transistor 110 and PMOS transistor 120 are turned on. With NMOS transistor 405 turned off in response to positive input voltages signal Vin_p switching to logic high (Vdd1), the source of PMOS transistor 305 is also forced to Vdd1 as the gate-to-source voltage Vgs for a transistor with no current flowing through it in this state must be zero.

Referring again to FIG. 3, it may be seen that the source for PMOS transistor 305 provides the bottom rail voltage for inverter 310. The source for PMOS transistor 305 may also be denoted as a first node. This bottom rail voltage (or equivalently, a first node voltage) is thus dynamically controlled: if the input voltage Vin_p is logic low, the bottom rail voltage is Vss2. As the input voltage Vin_p is switched to logic high, the bottom rail voltage bumps initially higher than Vdd1 but then settles to Vdd1.

The drain for PMOS transistor 305 is biased to intermediate voltage Vss2 from an intermediate voltage supply Vss2. Intermediate voltage Vss2 may be less than or equal to Vdd1. For example, if Vdd1 is 1.8 V, Vss2 may be 1.5 V. Alternatively, Vss2 may be slightly higher than Vdd1 given the proper device ratios. Thus, if Vdd1 is 1.8 V, Vss2 may range from 1.5 to 2 V.

As compared to the inverter formed by NMOS transistor 205 and PMOS transistor 215 in NAND gate 105, inverter 310 can switch states faster because the "feedforward" source follower character of PMOS transistor 305 as its gate voltage is raised to Vdd1 acts to switch NMOS transistor 405 off faster. The threshold voltage for inverter 310 lies between Vdd2 and the potential for the first node (the source voltage for PMOS transistor 305). When positive input voltage signal Vin_p is asserted to logic high, NMOS transistor 405 will thus begin to turn off even if PMOS transistor 315 is still starting to switch on since the source of NMOS transistor 405 is pulled higher than Vin_p by the Vgs for PMOS transistor 305. To turn off NMOS transistor 405, its gate must drop below the combination of its source voltage and its threshold voltage. For the inverter in NAND gate 105, the source voltage for NMOS transistor 205 is Vss2 as Vin_p is asserted to logic high. But for inverter 310, the source voltage for NMOS transistor 405 will be higher than such a value as discussed above. Thus, transistor 405 will switch off faster than NMOS transistor 205 discussed with regard to NAND gate 105. In sharp contrast, conventional NAND gate 105 requires the delays discussed earlier before PMOS transistor 210 can switch on to switch the inverter z output state. Accordingly, voltage translator 300 is remarkably faster with regard to switching states: for example, as little as 250 picoseconds or less.

Figure 2:
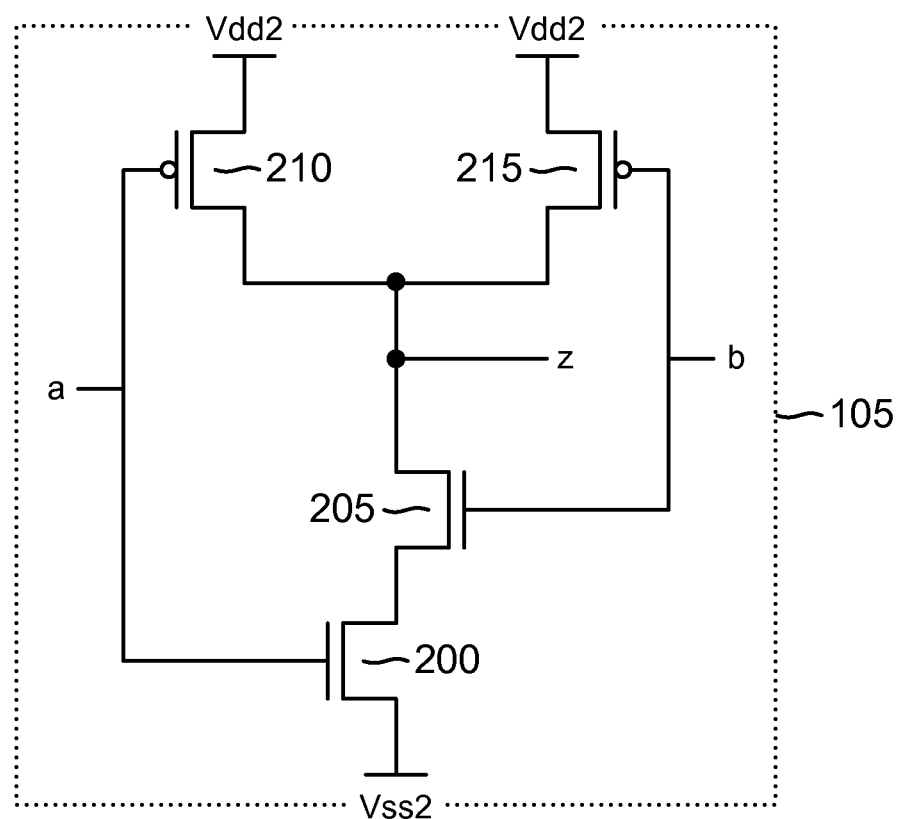
FIG. 2 is a schematic diagram for a NAND gate within the voltage translator circuit of FIG. 1.

Another factor helping increase the switching speed is that diode-connected PMOS transistors 120 and 125 no longer have to drive both an NMOS transistor 200 and a PMOS transistor as discussed earlier with regard to FIG. 2. Instead, PMOS transistors 120 and 125 only drive the gate of respective PMOS transistors 315. In this fashion, PMOS transistors 120 and 125 can turn on faster in that the capacitive load of NMOS transistor 200 is eliminated.

Figure 5:
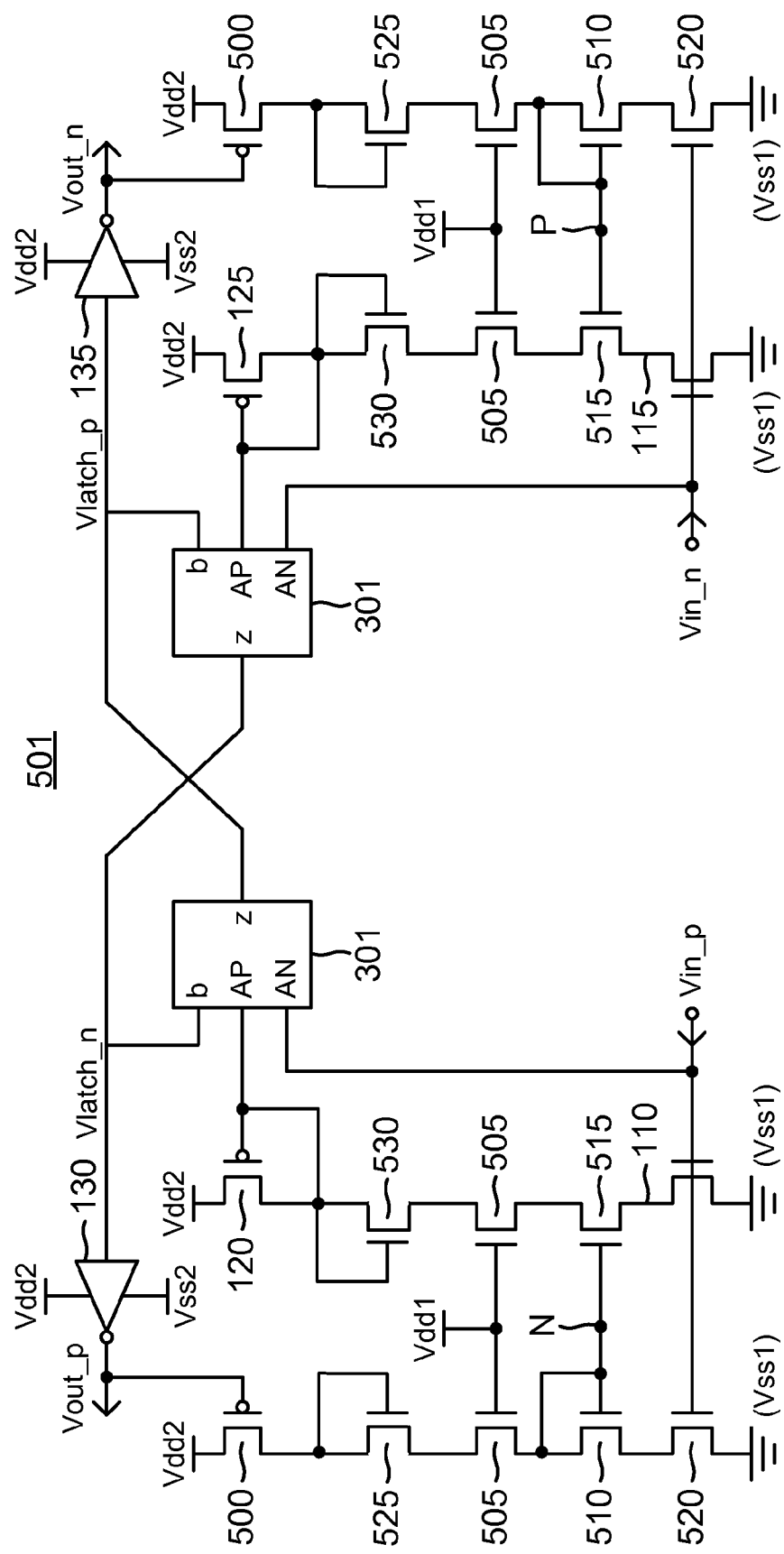
FIG. 5 is a schematic diagram of a modified version of the voltage translator circuit of FIG. 3.

Although the switching states are much faster, note that NMOS transistor 110 remains on while positive input signal Vin_p is in the logic high state. Current is thus flowing through the input path that comprises NMOS transistor 110 and diode-connected PMOS transistor 120. To stop this current flow, voltage translator 300 may be modified to include a feedback path for each logic gate 301 as shown in FIG. 5 for a voltage translator circuit 501. In that regard, each output voltage signal Vout_p and Vout_n may drive the gates of respective PMOS feedback transistors 500. The source of feedback PMOS transistors 500 is tied to the Vdd2 power supply. Thus, if Vout_p is Logic High (Vdd2), the corresponding feedback PMOS transistor 500 is turned off. The drain of each feedback PMOS transistor 500 couples indirectly to a drain of a corresponding NMOS transistor 510. The source for each NMOS transistor 510 couples to a drain of a corresponding NMOS transistor 520 whose source is tied to ground (Vss1). The positive input voltage signal Vin_p controls the gate of one NMOS transistor 520 whereas the negative input voltage signal Vin_n controls the gate of the remaining NMOS transistor 520.

If positive input voltage Vin_p is switched to logic high, the drain for corresponding NMOS transistor 520 is pulled to logic low (Vss1). Because the corresponding feedback PMOS transistor 500 is turned off at this time by output voltage signal Vout_p being pulled to Logic High (Vdd2), there is no current flowing through NMOS transistor 510. The gate-to-source voltage (Vgs) for NMOS 510 must then be zero, which means that its gate is also pulled to Vss1. A drain for NMOS transistor 110 couples to the source for an NMOS transistor 515 that is in a current mirror configuration with NMOS transistor 510. The logic high state for positive input voltage Vin_p has turned on NMOS transistor 110 at this time so its drain is pulled to Vss1. Thus, the source for NMOS transistor 515 is also pulled low to Vss1 at this time. Since the Vgs for transistor 515 is then zero, the current that was initially flowing through NMOS transistor 110 is stopped. In this fashion, power is saved using the feedback path formed by transistors 500, 510, 520, and 515. Since an analogous feedback path exists for output voltage signal Vout_n, power is saved regardless of which input voltage signal is being switched to logic high.

To save die space, the transistors in voltage translator 300 and 501 may be relatively small, thin-oxide devices. Such devices are not robust to being exposed to the full voltage difference between Vdd2 and Vss1, Thus, a cascode voltage stacking NMOS transistor 505 may be inserted between each NMOS transistor 510 and corresponding PMOS feedback transistor 500. Similarly, a cascode voltage stacking NMOS transistor 505 may be inserted between diode-connected PMOS transistor 120 and corresponding NMOS transistor 515 and also between diode-connected PMOS transistor 125 and corresponding NMOS transistor 515. The gates of cascode voltage stacking NMOS transistors 505 are tied to the low voltage supply Vdd1. Thus, the drains of cascode NMOS transistor 505 will not go higher than low voltage supply Vdd1, which protects transistors 510, 515, 520, and 110 from exposure to high voltage strain. An analogous cascode PMOS transistor (not illustrated) whose gate is tied to Vdd2 could protect feedback PMOS transistors 500 from high voltage strain.

To reduce the amount of voltage swing required to place feedback PMOS transistors 500 into the triode region of operation, their drains may be coupled to corresponding diode-connected NMOS transistors 525. This reduces the amount of time PMOS transistors 500 are conducting during switching to reduce power consumption. Similarly, a corresponding diode-connected NMOS transistor 530 couples to the drain of diode-connected PMOS transistor 120. In the same fashion, a corresponding diode-connected NMOS transistor 530 couples to the drain of diode-connected PMOS transistor 125.

Figure 6:
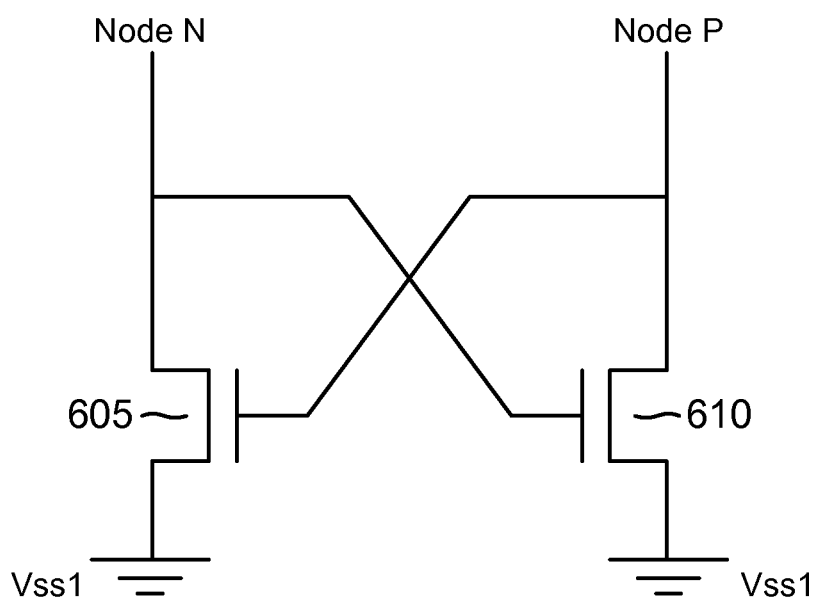
FIG. 6 is a schematic diagram of a latching circuit for the voltage translator circuit of FIG. 5.

With regard to positive input voltage signal Vin_p, an internal node N is defined by the gates of corresponding NMOS transistors 510 and 515. Similarly, with regard to negative input voltage signal Vin_n, an internal node P is defined by the gates of corresponding NMOS transistors 510 and 515. These nodes N and P may be used to drive the gates of respective latching transistors 605 and 610 as shown in FIG. 6. For example, suppose that positive input voltage signal Vin_p has been in the logic low state. Node N will thus be at Vdd1 whereas node P is at Vss1. When positive input voltage signal Vin_p is then switched to logic high (Vdd1), negative input voltage signal Vin_n is switched to logic low (Vss1). The switching of negative input voltage signal Vin_n to logic low begins to pull node P to Vdd1, which switches NMOS transistor 605 on to help pull node N to Vss1, which is where it should be when positive input voltage Vin_p switches to logic high. An analogous feedback occurs with regard to cutting off the current initially flowing in NMOS transistor 115 when negative input voltage signal Vin_n transitions to logic high because at the same time positive input voltage signal Vin_p switches to logic low. This logic low value for positive input voltage signal Vin_p pulls node N to Vdd1, which then turns on NMOS 610 to help pull node P to Vss1. Cross-coupled NMOS transistors 605 and 610 thus operate to assist the feedback operation described earlier with regard to transistors 500, 510, 515, and 520 to cutoff the current flowing in the input paths through transistors 110 and 115 to decrease switching time and further reduce power consumption.

Figure 7:
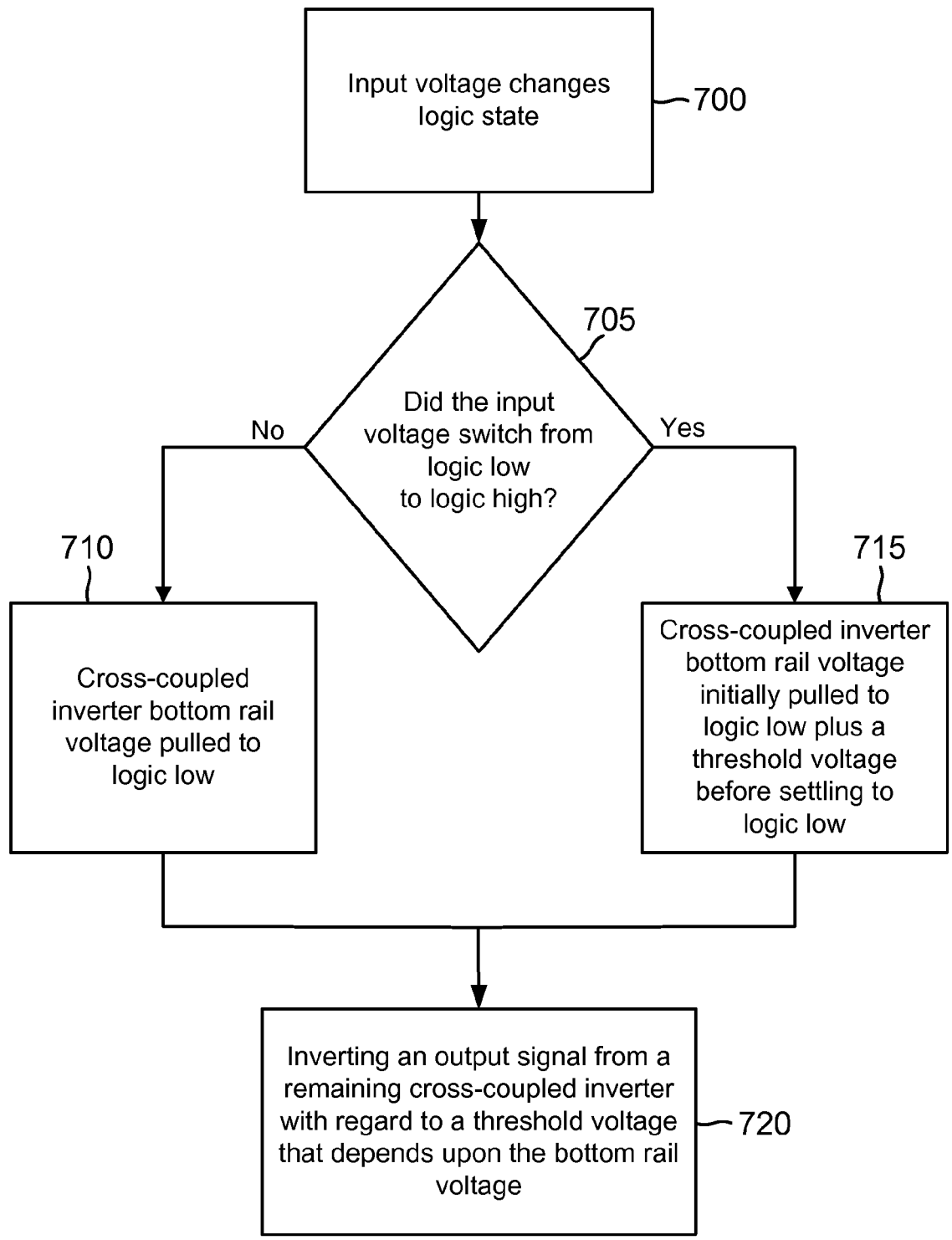
FIG. 7 is a flowchart for a method of translating an input voltage using cross-coupled inverters with dynamically adjusted bottom rail voltages.

A method of dynamically lowering the bottom rail voltage for cross-coupled inverters 310 will now be discussed with regard to the flowchart of FIG. 7. This method will be described with regard to a generic input voltage signal that corresponds to either positive input voltage signal Vin_p or negative input voltage signal Vin_n. The cross-coupled inverter and its bottom rail are also generic and correspond to the particular input voltage signal that is represented—if the generic input voltage signal represents positive input voltage signal Vin_p, then the method of FIG. 7 refers to the bottom rail for cross-coupled inverter 310 in positive logic gate XMP. Similarly, if the generic input voltage signal represents negative input voltage signal Vin_n, then the method of FIG. 7 refers to the bottom rail for cross-coupled inverter 310 in negative logic gate XMN. The method begins with the input voltage signal switching states in a step 700. If this state switching is from logic low to logic high as determined in a step 705, the bottom rail voltage for the cross-coupled inverter is initially raised to logic high plus a transistor threshold voltage before settling to logic high in a step 715. Conversely, if the state switching is from logic high to logic low, the bottom rail voltage for the cross-coupled inverter is pulled to the intermediate voltage Vss2 (Logic Low) in a step 710. In this fashion, the inverter bottom rail voltage is dynamically controlled depending upon the input voltage signal logic state transition. In a step 720, the cross-coupled inverter inverts an output signal from a remaining one of the cross-coupled inverters using a threshold voltage that depends upon (in part) the dynamically-adjusted bottom rail voltage.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. For example, such variations may include multiple intermediate voltage translations, or more complex logic functions with multiple inputs. In light of this, the scope of the present disclosure should not be limited to that of the particular embodiments illustrated and described herein, as they are merely by way of some examples thereof, but rather, should be fully commensurate with that of the claims appended hereafter and their functional equivalents.

I claim:

1. A voltage translator comprising:
    a pair of cross-coupled inverters, each cross-coupled inverter comprising an inverter PMOS transistor in series with an inverter NMOS transistor having a source coupled to a first node for the cross-coupled inverter, wherein each cross-coupled inverter is configured to invert an output signal from a remaining one of the cross-coupled inverters with respect to a threshold voltage having a value between a high voltage from a high voltage supply and a voltage for the cross-coupled inverter's first node; and
    a pair of first PMOS transistors corresponding to the pair of cross-coupled inverters, each first PMOS transistor coupling between the first node of its corresponding cross-coupled inverter and an intermediate voltage supply providing an intermediate voltage that is less than the high voltage, wherein one of the first PMOS transistors has its gate driven by an input voltage signal and a remaining one of the first PMOS transistors has its gate driven by a complement of the input voltage signal.

2. The voltage translator of claim 1, further comprising a pair of second PMOS transistors corresponding to the pair of cross-coupled inverters, each second PMOS transistor coupling between the high voltage supply and an output signal for its corresponding cross-coupled inverter.

3. The voltage translator of claim 2, further comprising a first diode-connected PMOS transistor having its source coupled to the high voltage supply and a drain coupled to a first NMOS transistor having its gate driven by the input voltage signal, wherein a gate for a positive one of the second PMOS transistors is coupled to a gate for the first diode-connected PMOS transistor.

4. The voltage translator of claim 3, further comprising a second diode-connected PMOS transistor having its source coupled to the high-voltage supply and a drain coupled to a second NMOS transistor having its gate driven by the complement of the input voltage signal, wherein a gate for a remaining negative one of the second PMOS transistors is coupled to a gate for the second diode-connected PMOS transistor.

5. The voltage translator of claim 4, further comprising a first inverter for inverting the output signal from a first one of the cross-coupled inverters to form an output voltage signal.

6. The voltage translator of claim 5, further comprising a second inverter for inverting the output signal from a remaining second one of the cross-coupled inverters to form a complement of the output voltage signal.

7. The voltage translator of claim 6, further comprising a first feedback path coupled to the output voltage signal and configured shut off current through the first NMOS transistor in response to the input voltage signal transitioning to a low voltage from a low voltage supply, the low voltage being higher than the intermediate voltage but less than the high voltage.

8. The voltage translator of claim 7, wherein the first feedback path includes a feedback PMOS transistor having its gate coupled to the output voltage signal and a source coupled to the high voltage supply.

9. The voltage translator of claim 7, further comprising a second feedback path coupled to the complement of the output voltage signal and configured to turn off the second NMOS transistor in response to the complement of the input voltage signal transitioning to the low voltage.

10. The voltage translator of claim 9, further comprising a cascode voltage stacking NMOS transistor in each of the first and second feedback paths.

11. A method, comprising:
biasing the voltage on a bottom rail for a cross-coupled inverter to a first level responsive to an input voltage signal transitioning from ground to a low voltage, wherein the cross-coupled inverter includes an inverter PMOS transistor in series with an inverter NMOS having its source coupled to the bottom rail;
biasing the voltage on the bottom rail to a second level responsive to the input voltage signal transitioning from the low voltage to ground, wherein the second level is lower than the first level;
in the cross-coupled inverter, inverting an output signal from a remaining cross-coupled inverter responsive to an inverter threshold voltage that depends on the biased bottom rail voltage and on a high voltage, wherein the high voltage is greater than the low voltage; and
biasing an output voltage signal to a translated voltage responsive to the inversion in the cross-coupled inverter, the translated voltage being a function of the input voltage signal.

12. The method of claim 11, wherein the second level equals an intermediate voltage that is less than the low voltage.

13. The method of claim 12, wherein the translated voltage equals the high voltage when the input voltage signal equals the low voltage.

14. The method of claim 12, wherein the translated voltage equals the intermediate voltage when the input voltage signal equals ground.

15. The method of claim 13, wherein the cross-coupled inverter is included in a voltage translator, the method further comprising:
conducting current through an input path to the voltage translator responsive to the input voltage signal transitioning to the low voltage; and
stopping the current conducting through the input path responsive to the output voltage signal being biased to the high voltage.

16. The method of claim 11, wherein biasing the bottom rail voltage to the first level comprises first biasing the bottom rail voltage to the low voltage plus a threshold voltage and subsequently biasing the bottom rail voltage to the low voltage.

17. A voltage translator comprising:
a pair of cross-coupled inverters, each cross-coupled inverter comprising an inverter PMOS transistor in series with an inverter NMOS transistor having a source coupled to a first node for the cross-coupled inverter, wherein each cross-coupled inverter is configured to invert an output from a remaining one of the cross-coupled inverters with respect to a threshold voltage having a value between a high voltage and a voltage for the cross-coupled inverter's first node; and
a first means for dynamically adjusting the first node voltage for a first one of the cross-coupled inverters to a first level responsive to an input voltage signal transitioning from ground to a low voltage and for dynamically adjusting the first node voltage for the first one of the cross-coupled inverters to a second level responsive to the input voltage signal transitioning from the low voltage to ground, wherein the first level is greater than the second level, and wherein the low voltage is lower than the high voltage and greater than the second level.

18. The voltage translator of claim 17, further comprising a second means for dynamically adjusting the first node voltage for a remaining second one of the cross-coupled inverters to the first level responsive to a complement of the input voltage signal transitioning from ground to the low voltage and for dynamically adjusting the first node voltage for the second one of the cross-coupled inverters to the second level responsive to the complement of the input voltage signal transitioning from the low voltage to ground.

19. The voltage translator of claim 17, wherein the first means includes an input path that conducts current responsive to the input voltage signal transitioning from ground to the low voltage.

20. The voltage translator of claim 19, further comprising a second means for turning off the current in the input path responsive to an output voltage signal transitioning to the high voltage.

* * * * *